United States Patent
Pendse et al.

(10) Patent No.: US 6,767,140 B2
(45) Date of Patent: Jul. 27, 2004

(54) CERAMIC OPTICAL SUB-ASSEMBLY FOR OPTO-ELECTRONIC MODULE UTILIZING LTCC (LOW-TEMPERATURE CO-FIRED CERAMIC) TECHNOLOGY

(75) Inventors: Neeraj Anil Pendse, Mountain View, CA (US); Bruce Carlton Roberts, San Jose, CA (US); Jia Liu, San Jose, CA (US); Lionel Auzereau, Le Cannet (FR); Christopher Barratt, Villeneuve-Loubet (FR)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/379,474

(22) Filed: Mar. 3, 2003

(65) Prior Publication Data

US 2003/0165303 A1 Sep. 4, 2003

Related U.S. Application Data

(63) Continuation-in-part of application No. 09/568,558, filed on May 9, 2000, now Pat. No. 6,707,140, and a continuation-in-part of application No. 10/165,553, filed on Jun. 6, 2002.
(60) Provisional application No. 60/331,339, filed on Aug. 3, 2001.

(51) Int. Cl.⁷ .............................................. G02B 6/36
(52) U.S. Cl. .................................. 385/89; 385/88
(58) Field of Search ........................... 385/14, 88–94

(56) References Cited

U.S. PATENT DOCUMENTS

| | | | | |
|---|---|---|---|---|
| 5,011,246 A | | 4/1991 | Corradetti et al. | 350/96.2 |
| 5,019,673 A | | 5/1991 | Juskey et al. | 174/52.2 |
| 5,139,969 A | | 8/1992 | Mori | 437/183 |
| 5,199,087 A | * | 3/1993 | Frazier | 385/14 |
| 5,352,926 A | | 10/1994 | Andrews | 257/717 |
| 5,416,872 A | * | 5/1995 | Sizer et al. | 385/92 |
| 5,487,124 A | | 1/1996 | Bowen et al. | 385/93 |
| 5,579,208 A | | 11/1996 | Honda et al. | 361/813 |
| 5,608,262 A | | 3/1997 | Degani et al. | 257/723 |

(List continued on next page.)

FOREIGN PATENT DOCUMENTS

| JP | 60-202956 | 10/1985 | H01L/23/36 |
|---|---|---|---|
| JP | 08-125066 | 5/1996 | H01L/23/12 |

OTHER PUBLICATIONS

S. Savastiouk, Ph.D., et al. "3–D stacked wafer–level packaging", Mar. 2000, *Advanced Packaging*, pp. 28–34.
National Semiconductor, "Packaging Databook", *1993 National Semiconductor*, pp. v–xi to 1–3 to 1–4, 3–1 to 3–20, 3–30 to 3–31, 3–62 to 3–69.

*Primary Examiner*—Phan T. H. Palmer
*Assistant Examiner*—Jennifer Doan
(74) *Attorney, Agent, or Firm*—Beyer Weaver & Thomas, LLP

(57) ABSTRACT

A high performance ceramic block for use with small-scale circuitry is described. The block can be used in an optical sub-assembly (OSA) suitable for optical interconnection with optical fibers and electrical interconnection with a chip sub-assembly (CSA) is formed. The block includes a first surface and a second surface and is formed using one of low temperature co-fired ceramic (LTCC) and high temperature co-fired ceramic (HTCC) techniques. Photonic devices are formed on the first surface of the ceramic block and electrical contacts are formed on a second surface of the block. The electrical contacts being suitable for electrical communication with a chip sub-assembly. Electrical connections are formed so that they pass internally through the ceramic block to electrically interconnect the photonic devices on the first face of the block with the electrical contacts on the second face of the block. Such a block can be advantageously used to form an optoelectronic module.

34 Claims, 7 Drawing Sheets

U.S. PATENT DOCUMENTS

| | | | | |
|---|---|---|---|---|
| 5,631,991 A | * | 5/1997 | Cohen et al. | 385/93 |
| 5,723,369 A | | 3/1998 | Barber | 438/106 |
| 5,726,079 A | | 3/1998 | Johnson | 438/106 |
| 5,790,384 A | | 8/1998 | Ahmad et al. | 361/760 |
| 5,790,733 A | * | 8/1998 | Smith et al. | 385/88 |
| 5,798,567 A | | 8/1998 | Kelly et al. | 257/723 |
| 5,949,135 A | | 9/1999 | Washida et al. | 257/685 |
| 6,043,430 A | | 3/2000 | Chun | 174/52.4 |
| 6,201,704 B1 | | 3/2001 | Poplawski et al. | 361/753 |
| 6,236,109 B1 | | 5/2001 | Hsuan et al. | 257/688 |
| 6,258,630 B1 | | 7/2001 | Kawahara | 438/122 |
| 6,305,848 B1 | | 10/2001 | Gregory | 385/53 |
| 6,316,837 B1 | | 11/2001 | Song | 257/778 |
| 6,316,838 B1 | | 11/2001 | Ozawa et al. | 257/778 |
| 6,318,909 B1 | | 11/2001 | Giboney et al. | 385/90 |
| 6,328,483 B1 | * | 12/2001 | Havasi et al. | 385/92 |
| 6,364,542 B1 | * | 4/2002 | Deane et al. | 385/92 |
| 6,530,699 B1 | * | 3/2003 | Gilliland et al. | 385/88 |
| 6,628,000 B1 | * | 9/2003 | Pham et al. | 257/797 |
| 6,642,613 B1 | * | 11/2003 | Nguyen et al. | 257/686 |
| 6,659,659 B1 | * | 12/2003 | Malone | 385/94 |
| 2001/0013645 A1 | * | 8/2001 | King et al. | 257/678 |

* cited by examiner

CERAMIC OPTICAL SUB-ASSEMBLY FOR OPTO-ELECTRONIC MODULE UTILIZING LTCC (LOW-TEMPERATURE CO-FIRED CERAMIC) TECHNOLOGY

CROSS-REFERENCE TO RELATED PATENTS AND APPLICATIONS

This application is a continuation-in-part of U.S. patent application Ser. No. 09/568,558, entitled "ARRAYABLE, SCALABLE AND STACKABLE MOLDED PACKAGE CONFIGURATION," filed on May 9, 2000 now U.S. Pat. No. 6,707,140, and of U.S. patent application Ser. No. 10/165,553, entitled "OPTICAL SUB-ASSEMBLY FOR OPTOTELECTRONIC MODULES," filed on Jun. 6, 2002, which claims priority from U.S. Provisional Application No. 60/331,339, filed on Aug., 3, 2001, the content of each of which are hereby incorporated by reference.

This application is related to U.S. Pat. No. 6,364,542, entitled "DEVICE AND METHOD FOR PROVIDING A TRUE SEMICONDUCTOR DIE TEXTERNAL FIBER OPTIC CABLE CONNECTION", filed on May 9, 2000, to U.S. patent application Ser. No. 09/713,367, entitled "MINIATURE OPTO-ELECTRIC TRANSCEIVER," filed on Nov. 14, 2000, to U.S. patent application Ser. No. 09/922,358, entitled "MINIATURE SEMICONDUCTOR PACKAGE FOR OPTO-ELECTRONIC DEVICES", filed on Aug. 3, 2001, to U.S. patent application Ser. No. 09/947,210, entitled "TECHNIQUES FOR JOINING AN OPTO-ELECTRONIC MODULE TO A SEMICONDUCTOR PACKAGE", filed on Aug. 3, 2001, and to U.S. patent application Ser. No. 10/290,481, entitled "TWO-LAYER ELECTRICAL SUBSTRATE FOR OPTICAL DEVICES", filed on Nov. 6, 2002, the content of each of which are hereby incorporated by reference.

This application is also related to U.S. patent application Ser. No. 10/165/711, entitled "CERAMIC OPTICAL SUB-ASSEMBLY FOR OPTO-ELECTRONIC MODULES" on Jun. 6, 2002, which is a continuation-in-part of U.S. patent application Ser. No. 10/165,553, the content of which is hereby incorporated by reference.

FIELD OF THE INVENTION

The present invention relates generally to techniques for connecting the optical and electrical device components. More particularly, the invention relates to LTCC (low temperature co-fired ceramic) structures for use in optical sub-assemblies.

BACKGROUND OF THE INVENTION

Many computer and communication networks being built today, including the Internet, are using fiber optic cabling instead of copper wire. With fiber optic cabling, data is transmitted using light signals, not electrical signals. For example, a logical one may be represented by a light pulse of a specific duration and frequency, a logical zero may be represented by the absence of a light pulse for the same duration. Optical fiber has the advantage of having a much greater bandwidth than copper wire.

While fiber optic cabling is very efficient for transferring data, the use of light signals to process data is still very difficult. For instance, currently there is no efficient way to "store" light signals representative of data. Networks therefore use fiber optics for transmitting data between nodes and silicon chips to process the data within computer nodes. This is accomplished by using fiber optic transceivers, which convert light signals from a fiber optic cable into electrical signals, and vice versa. FIG. 1 illustrates a perspective view of an exemplary optoelectronic module 100 that can be used to form an optical transceiver.

Optoelectronic module 100 includes a semiconductor chip subassembly (CSA) 102 and an optical subassembly (OSA) 104. CSA 102 is a packaged semiconductor device. As shown in FIG. 1, CSA 102 is a rectangular block of molding material 106 that has electrical contacts 108 exposed through its bottom and side surfaces. Within the block of molding material 106 is a semiconductor die that is electrically connected to contacts 108. For instance, wire bonds can be used for such connections. Another aspect of CSA 102 that cannot be seen is the up-linking contacts on the top surface of CSA 102. These up-linking contacts are also electrically connected to the encapsulated semiconductor die and therefore provide the electrical communication between the semiconductor die and OSA 104. The specific CSA 102 that is shown is a leadless leadframe semiconductor package (LLP). However, it should be understood that CSA 102 can be formed of various types of molded packages.

A conventional OSA 104 includes a conventional backing block 110, a circuitry substrate 112, and photonic devices 114. Backing block 110 has a front surface 116 that supports circuitry substrate 112 and photonic devices 114, which are attached to circuitry substrate 112. A conventional backing block 110 can be formed of a variety of materials such as a ceramic material, polyethylene ether ketone (PEEK), or liquid crystal polymer (LCP). Examples of such conventional OSA's 104 and backing blocks 104 are known to persons having ordinary skill in the art. One typical example of such a conventional backing block is described, for example, in the U.S. patent application Ser. No. 10/165/711, entitled "CERAMIC OPTICAL SUB-ASSEMBLY FOR OPTO-ELECTRONIC MODULES," filed on Jun. 6, 2002.

In conventional implementation, a circuitry substrate 112 is attached to a front surface 116 of backing block 110, wraps around the bottom-front corner of backing block 110, and covers most of the bottom surface of backing block 110. Traces of the circuitry substrate 112 run from photonic devices 114 on the front surface to the bottom surface of backing block 110 where they make contact with the up-linking contacts of CSA 102. In an effort to maximize the number of electrical connections possible, size dimensions of the foregoing devices are small. However, even though the size dimensions are made small, the fact that the circuitry substrate 112 is formed only at the surface (or in some implementations two layers deep) of the backing block 110 limits the overall number of electrical connections that can be made from the photonic devices 114 to contacts of the CSA 102.

Additionally, such surface mounted circuitry substrates 112 can suffer from "cross-talk". In typical implementation, size dimensions involved with circuitry substrate 112 are small and cause the circuit traces to be positioned very close to each other. The small size is advantageous in the same way that small sizes for most electronic devices are advantageous. However, the close proximity of the traces can cause "cross-talk," especially at high operational frequencies. Cross-talk is the electrical interference between two or more electrically conducting elements. Such cross-talk can drastically reduce the performance of optoelectronic device 100.

FIG. 2 is a schematic depiction of a conventional backing block 204 (depicted upside down) showing a bottom side 201 and a facing side 202. Commonly, the photonic devices 214 are formed on the facing side 202 of the block 204 and electrically connected to contact pads 215 on the bottom side 201. The photonic devices 214 are electrically connected to contact pads 215 using surface metallization techniques. Typically, the photonic devices 214 are electrically connected to contact pads 215 using electric traces (or leads) 216 formed on a special contact tape that adheres to the block 204. A problem with this implementation is that the electric traces 216 have a tendency to fail in the region where the tape bends over the edge 217 of the block 204.

In view of the foregoing, what is needed is an efficient technique for forming high density electrical connections from the photonic devices of an optical device to an associated semiconductor chip device such that the connections exhibit high circuit density and low levels of cross-talk.

BRIEF SUMMARY OF THE INVENTION

The present invention is directed to a high performance and small-scale circuitry substrate and supporting block used in optical sub-assemblies. In one embodiment an optical sub-assembly (OSA) suitable for optical interconnection with optical fibers and electrical interconnection with a chip sub-assembly (CSA) is formed. The OSA includes a ceramic block having a first surface and a second surface, the ceramic block being formed using one of low temperature co-fired ceramic (LTCC) and high temperature co-fired ceramic (HTCC) techniques. Photonic devices are formed on the first surface of the ceramic block and electrical contacts are formed on a second surface of the block. The electrical contacts being suitable for electrical communication with a chip sub-assembly. Moreover, the electrical connections being formed so that they pass internally through the ceramic block to electrically interconnect the photonic devices on the first face of the block with the electrical contacts on the second face of the block.

Another embodiment includes a ceramic block having a first face and a second face. The block being formed using one of low temperature co-fired ceramic (LTCC) and high temperature co-fired ceramic (HTCC) techniques. The first face of the ceramic block has at least one photonic device formed thereon. Contact pads are formed on the second face of the ceramic block. The block also includes electrical connections that are electrically connected to the photonic devices and pass through internal portions of the ceramic block to so that the electrical connections can electrically the photonic devices to a chip sub-assembly (CSA). The electrical connections can include both signal connections and ground connections. Moreover, embodiments can include internal shielding layers. The configuration of the block can be designed so that cross-talk is reduced, low levels of ground-bounce and electrical parasitics are exhibited, and optimal impedance levels can be obtained. The circuitry substrate can be advantageously used to form an optical sub-assembly (OSA) used in an optoelectronic module.

In another embodiment, the ceramic block includes a plurality of ceramic layers formed using one of low temperature co-fired ceramic (LTCC) techniques and high temperature co-fired ceramic (HTCC) techniques. The ceramic block includes a front surface and a bottom surface. The front surface of the block includes a plurality of contact pads with a plurality of photonic devices. The bottom surface includes a plurality of solder pads. The block further includes internal electric contact planes having at least one electric contact line formed thereon such that the at least one electric contact line passes internally through the ceramic block and is in electrical communication with the contact pads and associated solder pads. The contact pads having wire bonds for electrically connecting the contact pads with the photonic devices. The block also includes at least one internal ground plane having at least one ground contact line formed thereon such that the at least one ground contact line passes internally through the ceramic block and is in electrical communication with selected solder pads. The module further including a semiconductor chip sub assembly (CSA) having a top surface that has exposed up-linking contacts that are in electrical contact with the solder pads formed on the bottom surface of the ceramic block when the ceramic block is placed onto the top surface of the CSA.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

It is to be understood that, in the drawings, like reference numerals designate like structural elements. Also, it is understood that the depictions in the Figures are not necessarily to scale.

DETAILED DESCRIPTION OF THE INVENTION

Figure 1:
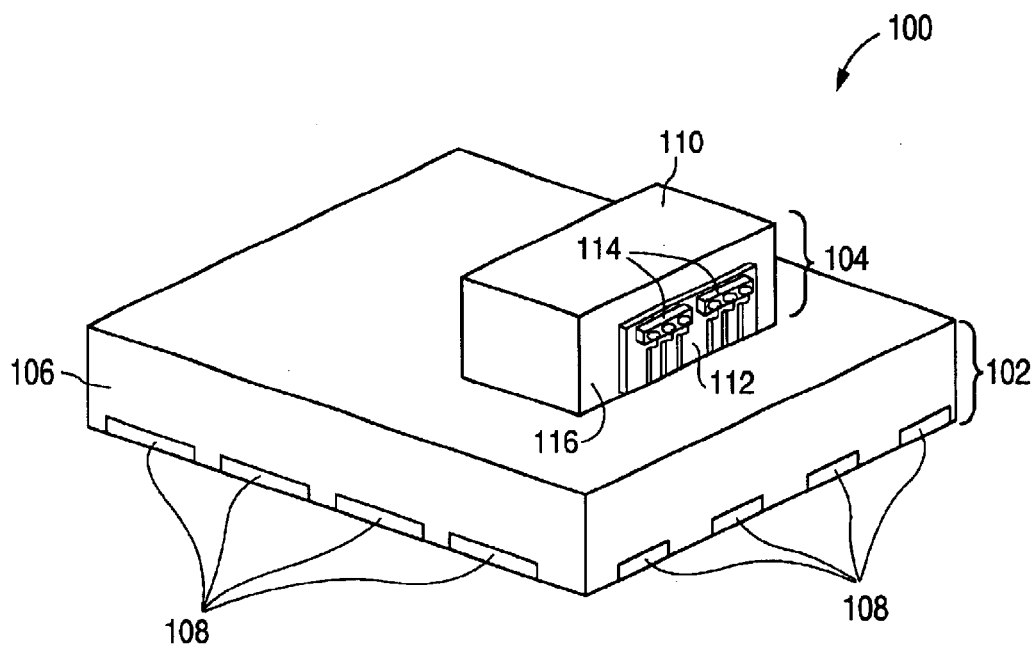
FIG. 1 is a simplified perspective view depiction of a conventional optoelectronic module that can be used to form an optical transceiver.
Figure 2:
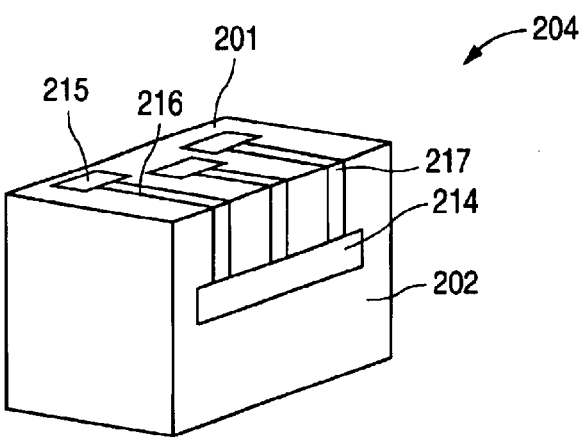
FIG. 2 is a simplified perspective view of a conventional backing block used in a conventional optical subassembly.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

One of the limitations of existing technologies used in optical sub-assemblies is the need to form all the electrical interconnections between the photonic devices and the underlying chip sub-assembly (CSA) using surface metallization techniques that form electrical interconnect structures that are one, or at most two layers deep. This results in limited electrical contact density and also results in enormous cross-talk problems between the various electrical interconnections. Cross-talk in existing technologies can run as high as 75%. Moreover, as data transmission rates increase, this problem will likely increase.

The present invention pertains to high performance and small-scale OSA's. An improved OSA of the present invention includes a ceramic block formed of several layers of low temperature co-fired ceramic (LTCC) or high temperature co-fired ceramic (HTCC). A photonic device, or more generally a plurality of photonic devices is formed on one face of the ceramic block. The photonic devices are electrically connected to a plurality of solder pads formed on another face of the ceramic block. Importantly, the electrical connections between the photonic devices and the solder pads pass through internal portions of the ceramic block. Such structures are made possible through the use of LTCC and HTCC technologies. The configuration of the electrical interconnections that pass through internal portions of the ceramic block are designed so that cross-talk is reduced, low levels of ground-bounce and parasitics are exhibited, and optimal impedance levels are obtained. An OSA incorporating such a ceramic block can be advantageously used to form an optoelectronic module.

To achieve the desired properties in a ceramic block constructed in accordance with the principles of the invention, multi-layered ceramic (MLC) fabrication technologies are used. Such technologies are described, for example, in Microelectronics Packaging Handbook, Van Nostrand Reinhold publishers, New York 1989, at pages 455–522 which provides for a thermally efficient, multi-component ceramic structures capable of supporting three-dimensional interconnect circuitry.

In general, such ceramic structures are formed using particles of high temperature withstanding dielectric material such as alumina and glass suspended in an organic binder and formed and dried into so-called "green sheets". Individual sheets of tape are printed with metallization and other circuit patterns, stacked on each other, laminated together at a predetermined temperature and pressure, and then fired at an elevated temperature routine upon which the majority of the binder material vaporizes off while the remaining material fuses or sinters. Where alumina glass is generally used as the insulating material, tungsten, molybdenum or molymanganese or other suitable materials are typically used for metallization. The green sheets are patterned and then stacked in an appropriate configuration. The stacked laminates are then fired at temperatures of about 1,600° C. (degrees Celsius) in a reducing atmosphere such as hydrogen. This is known as high temperature co-fired ceramic (HTCC) technology. In a typical HTCC process, high-melting point refractory metal pastes are used as conductors.

Other ceramic laminate processes that do not require high processing temperatures or a hydrogen atmosphere are referred to generally, as low temperature co-fired ceramic (LTCC) technology. Low temperature ceramic tape is commercially available from DuPont Company as a GREEN TAPE brand ceramic tape which sinters at approximately 850° C. and exhibits thermal expansion similar to alumina. The low temperature processing permits the use of highly conductive precious metal thick film conductors such as gold, silver or their alloys.

A discussion of thick film technology, and high and low temperature co-fired ceramic tape technology is found in "Development of a Low Temperature Co-fired Multilayer Ceramic Technology", by William Vitriol et al., ISHM Proceedings 1983, pages 593–598.

Although both HTCC and LTCC technologies can be used in accordance with the principles of the invention, LTCC technology is the preferred implementation.

Figure 3:
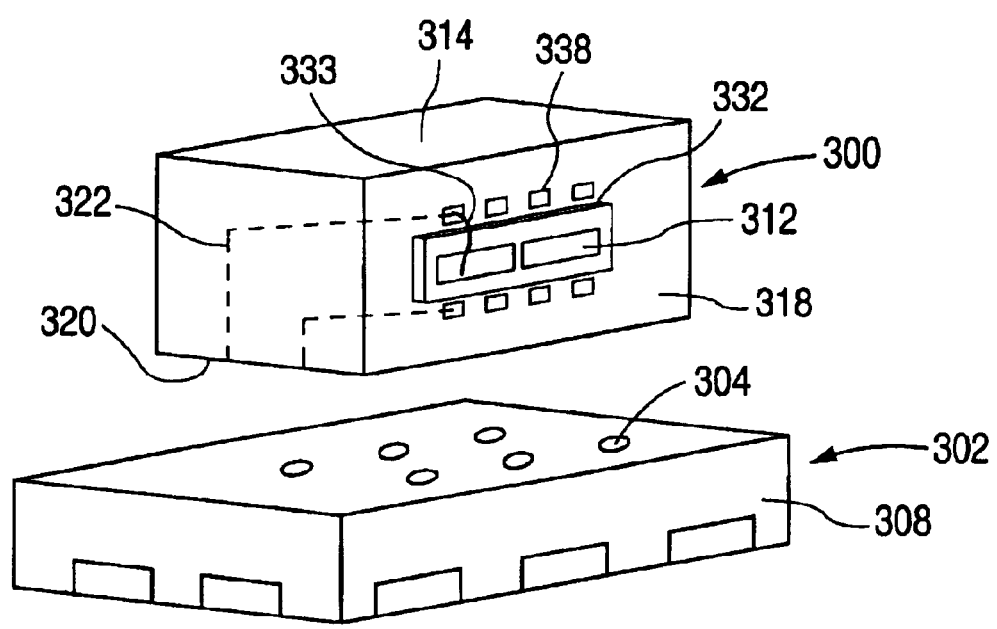
FIG. 3 is a simplified perspective view of an embodiment of an opto-electronic module including an OSA and CSA in accordance with the principles of the invention.

Ceramic components can be constructed using such HTCC and LTCC techniques. For example, a ceramic block can be constructed and used to connect various types of electrical systems of an opto-electronic module. The advantages of such a ceramic block are more fully evident when connecting electrical systems at a small dimensional scale. For instance, the block can be used to connect an optical device to a semiconductor chip device in an optoelectronic module. FIG. 3 will now be described to explain such a use of such a ceramic block.

FIG. 3 comprises schematic depictions of a simplified optical subassembly (OSA) 300 and a chip subassembly (CSA) 302, according to one embodiment of the present invention. OSA 300 and CSA 302 can be combined to form an optoelectronic module. OSA 300 and CSA 302 are placed in electrical connection with each other by connecting the up-linking contacts 304 on the top surface of CSA 302 with the contact pads (not shown in this view) on the bottom surface of OSA 300. These connections can be facilitated by the use of conductive materials including, but not limited to, solder paste and conductive epoxy.

A CSA 302 is a packaged semiconductor device (substantially similar to the CSA 102 described in FIG. 1) in which a semiconductor die (not shown) is encapsulated within a molding material 308 and electrically connected to up-linking contacts 304. Up-linking contacts 304 provide the path for electrical communication between the semiconductor die with the photonic devices 312 of OSA 300.

An OSA 300 includes a ceramic block 314 (also referred to herein as a ceramic body) having a front surface 318 and a bottom surface 320. Typically, a device attachment area 332 is formed on the front surface 318. The device attachment area 332 is also referred to as a cathode pad. Photonic devices 312 are attached to the front surface 318 of the ceramic block 314 at the device attachment area 332. Also, the front surface 318 includes contact pads 338 formed thereon. Wire bonds 333 electrically contact the photonic devices 312 to the contact pads 338. Signal connections 322 that pass through internal portions of the ceramic block 314 (depicted schematically by the dashed internal lines) electrically connect the bond pads 338 to solder pads (not seen in this view). In this way the photonic devices 312 can be connected to the up-linking contacts 304 of a chip sub-assembly (CSA) 302 so that they can ultimately be connected to the semiconductor die within CSA 302.

To better illustrate the structure and features of a ceramic block embodiment and its associated electrical connections, discussion of ceramic block embodiment will be made with reference to FIGS. 3 and 4A–C. While FIG. 3 shows a ceramic block embodiment 314 in a perspective view, FIGS. 4A–C illustrate a ceramic block embodiment 314 in a cross-section side view, a front plan view that looks onto front surface 318 of ceramic block 314, and a bottom plan view that looks onto bottom surface 320 of ceramic block 314, respectively.

Figure 4A:
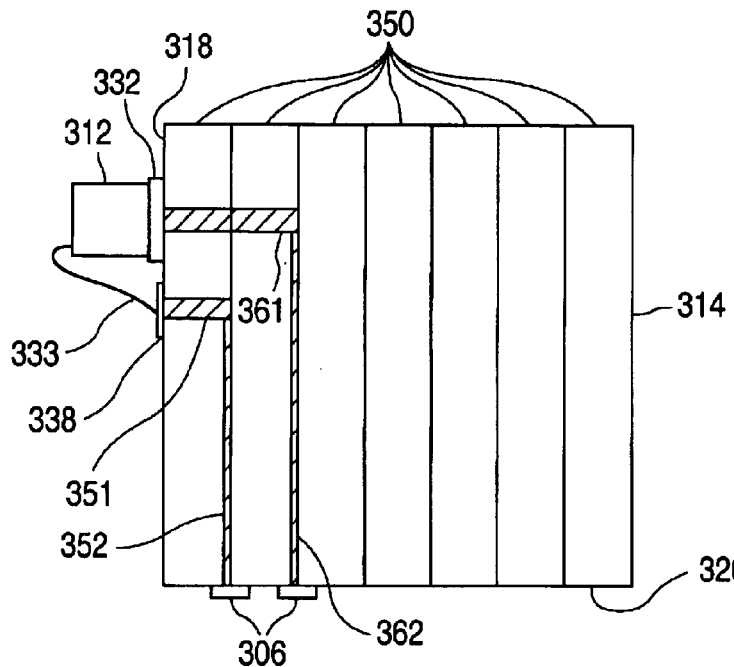
FIGS. 4A, 4B, and 4C illustrate a ceramic block embodiment, in a cross-section view, a front plan view that looks onto a front surface of a ceramic block, and a bottom plan view that looks onto a bottom surface of a ceramic block, respectively.
Figure 4B:
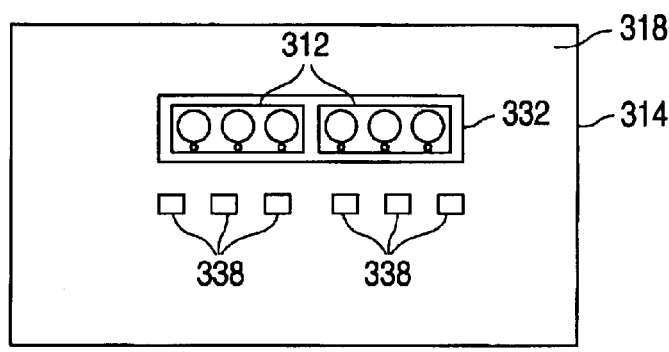
Figure 4C:
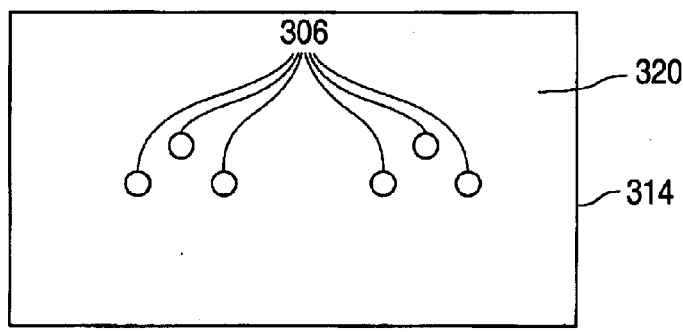

Referring to FIGS. 4A, 4B, and 4C one implementation of a ceramic block OSA is depicted. FIG. 4A is a cross-section view, FIG. 4B is a plan view of a facing surface, and FIG. 4C is a plan view of a bottom surface. Referring to FIG. 4A, ceramic block 314 is constructed from a plurality of ceramic layers 350. The front surface 318 of the depicted block 314 includes a device attachment area 332 having photonic devices 312 formed thereon. Additionally, the depicted embodiment has contact pads 338 formed on the front surface 318 and contact pads 306 (herein such pads 306 are differentiated from the contact pads 338 of the front surface 318 by referring to them as solder pads 306) formed on the bottom surface 320. The contact pads 338 are electrically connected to contact points on the photonic devices 312. Typically, such connections are achieved using wire connectors 333 that are typically formed of gold but can comprise any suitably conductive material. Underlying the depicted contact pad 338 is a signal connection that passes through internal portions of the ceramic block 318. The signal connection being formed to facilitate an electrical connection between the photonic device and the uplinking contacts 304 of a chip sub-assembly (CSA). In the depicted embodiment, the signal connection includes a signal via 351, a signal trace 352, a corresponding contact pad 338, and a corresponding solder pad 306. The signal via 351 is formed by metallizing an opening in one or more ceramic layer(s) 350. Additionally, an associated signal trace 352 is formed on a ceramic layer 350. The signal via 351 is electrically connected to the associated signal trace 352. The signal via 351 is electrically connected to a corresponding contact pad 338 and the signal trace 352 is electrically connected to a corresponding solder pad 306. The signal via 351, contact pad 338, signal trace 352, and solder pad 306 are typically formed of copper materials. However, many other conductive materials may be readily used.

Underlying the device attachment area 332 and photonic devices 312 formed thereon is a ground connection that passes through internal portions of the ceramic block 318. The ground connection being formed to facilitate an electrical connection between the photonic device uplinking contacts 304 of a chip sub-assembly (CSA). In the depicted embodiment, the ground connection includes a ground via 361 and a ground line 362. The ground connection is electrically connected to the device attachment area 332 (and thereby to an associated photonic device 312) and a corresponding solder pad 306. Thus, a ground connection electrically interconnects a photonic device 312 to uplinking contacts 304 of a chip sub-assembly (CSA). The ground via 361 is formed by metallizing an opening in one or more ceramic layer(s) 350 and an associated ground line 362 is formed on a ceramic layer 350. As with the signal connection, the ground via 361, ground line 362, and solder pad 306 are typically formed of copper materials. However, many other conductive materials may be readily used.

It is to be noted that the ground line 362 can comprise a single ground line to which all the photonic devices 312 are electrically connected and thereby grounded. Alternatively, and advantageously, the ground line 362 can comprise a plurality of ground lines so that each photonic device 312 can be individually grounded. Such an implementation can provide superior resistance to cross-talk.

Figure 5A:
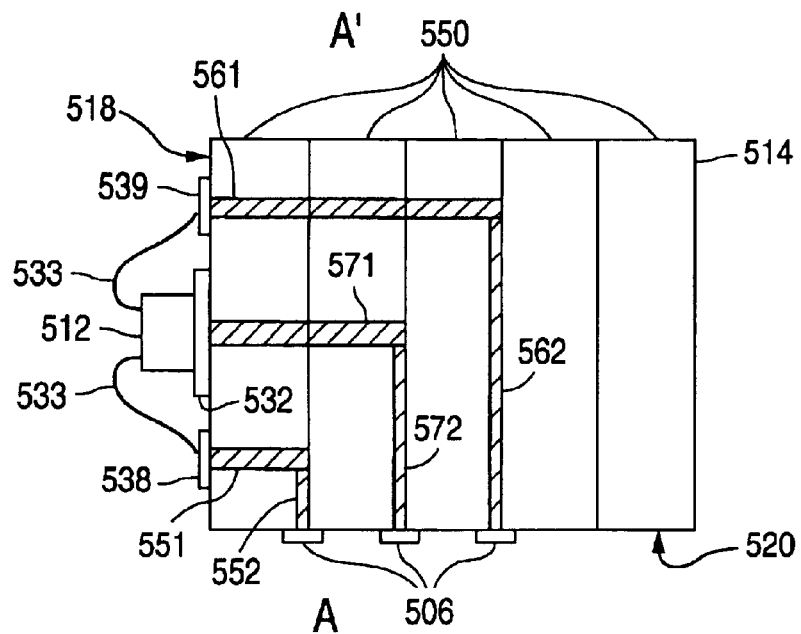
FIGS. 5A–5B include a cross section view and facing view of a ceramic block embodiment. The depicted embodiment features an alternating contact pad configuration according to one embodiment of the present invention.
Figure 5B:
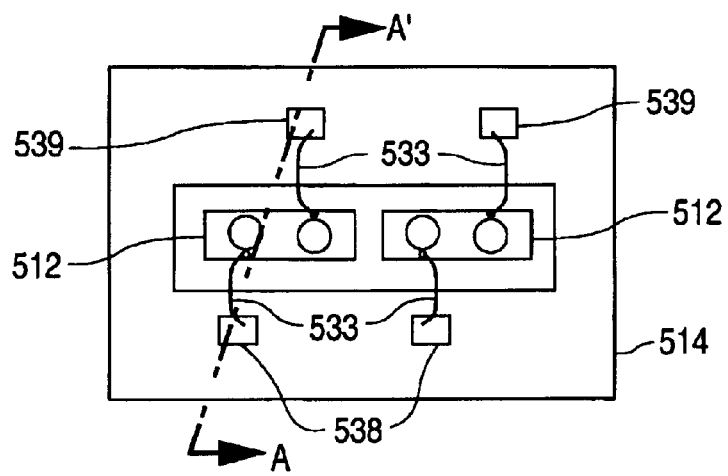

Another embodiment of the invention is depicted with respect to FIGS. 5A–5B. Such an embodiment implements an alternating contact pad configuration. FIG. 5A is a cross section view of a ceramic block embodiment. FIG. 5B is a plan view of a face surface of the ceramic block embodiment depicted in FIG. 5A. The cross-section view of FIG. 5A is taken along the line A–A' of FIG. 5B. As with the previously disclosed embodiments the depicted ceramic block 514 can be used in an optical subassembly (OSA) used in an optoelectronic module.

The ceramic block 514 has a front surface 518 and a bottom surface 520. The depicted embodiment includes a device attachment area 532 (cathode pad) is formed on the front surface 518. Photonic devices 512 are formed at the device attachment area 532. Additionally, contact pads are formed on the front surface 518 of the block 514. In the depicted implementation, the contact pads include a first set of contact pads 538 and a second set of contact pads 539. The first set of contact pads 538 and second set of contact pads 539 are configured in a staggered arrangement with respect to each other. This is more easily seen with reference to FIG. 5B which depicts the offset staggered configuration of the contact pads 538 of the first set of contact pads with respect to the contact pads 539 of the second set of contact pads. Such a configuration allows more separation between the contact wires 533 that connect the photonic devices 512 to the contact pads 538, 539. This increased separation reduces cross-talk. This feature becomes extremely advantageous in embodiments having many photonic devices 512. In general, where n photonic devices are employed, a first set of n/2 bond pads are formed on one side of the photonic devices and a second set of n/2 other bond pads are formed on an opposing side of the photonic devices As with the previously described embodiments, the front surface 518 includes contact pads 538, 539 formed thereon. For the first set of bond pads 538, signal connections pass through internal portions of the ceramic block 514 to electrically connect the first set of contact pads 538 to the solder pads 306 formed on the bottom surface 520 of the block. In this way the photonic devices 512 can be connected to the up-linking contacts of a chip sub-assembly (CSA) and ultimately be connected to the associated semiconductor die within the CSA. As previously described, the signal connections include signal vias, signal traces, and corresponding contact pads and solder pads. Referring to FIG. 5A, a contact pad 538 includes a signal via 551 that passes through one or more ceramic layers 550 of the block 514. The signal via 551 is electrically connected to a signal trace 552 formed on one of the ceramic layers 550. The signal trace 552 extends to edge of the block 514 at the bottom surface 520 where a solder pad 506 is formed thereon. Similarly, for the second set of bond pads 539, signal connections pass through internal portions of the ceramic block 514 to electrically connect the second set of bond pads 539 to the solder pads 306 formed on the bottom surface 520 of the block. The signal connection for contact pad 539 includes a signal via 561 that passes through one or more ceramic layers 550 of the block 514 and electrically connects to a signal trace 562 formed on one of the ceramic layers 550. Signal trace 562 extends to the bottom surface 520 of the block 514 where a solder pad 506 is formed thereon. In the depicted embodiment, a single ground is used.

Additionally, the block 514 includes ground connections that pass through internal portions of the ceramic block 514. As previously described, each ground connection is electrically connected to the device attachment area 532 (and thereby to an associated photonic device 512) and a corresponding solder pad 506. Thus, a ground connection electrically interconnects a photonic device 512 to uplinking contacts of a chip sub-assembly (CSA). A ground via 571 is formed in one or more ceramic layer(s) 550 and an associated ground line 572 is formed on a ceramic layer 550. It is to be noted that the depicted ground line 572 can comprise a single ground line to which all the photonic devices 512 are electrically connected and thereby grounded. Alternatively, and advantageously, the ground line 572 can comprise a plurality of ground lines so that each photonic device 512 can be individually grounded.

Figure 6A:
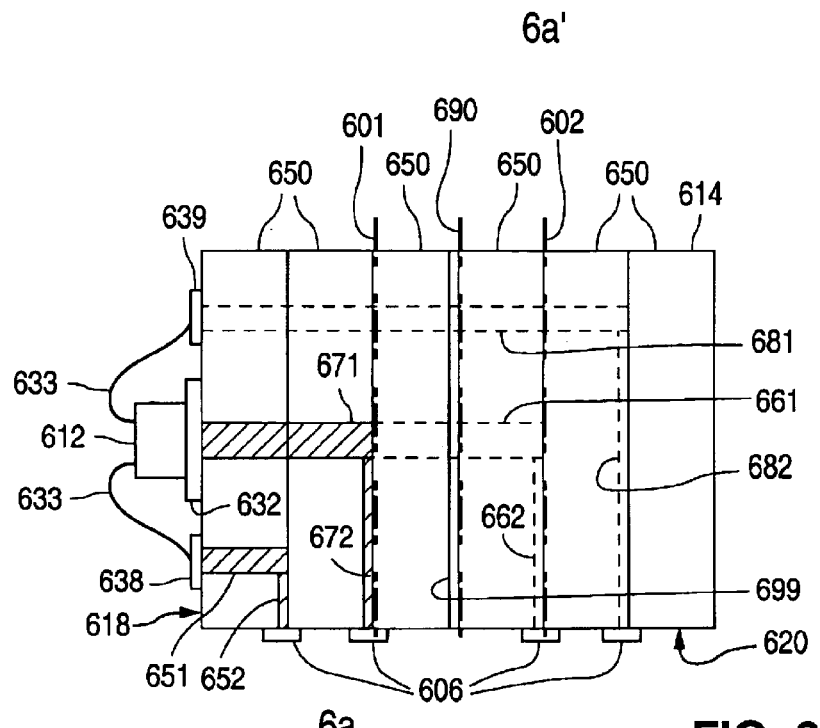
FIGS. 6A, 6B, and 6C are simplified depictions of yet another ceramic block embodiment, including a cross-section view, a front plan view that looks onto a front surface of a block, and a bottom plan view that looks onto a bottom surface of a block, respectively.
Figure 6B:
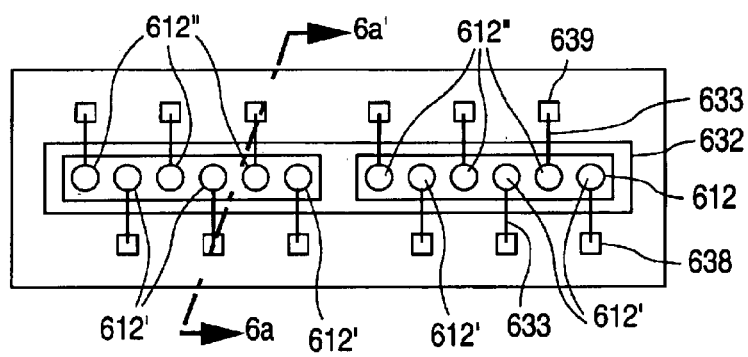
Figure 6C:
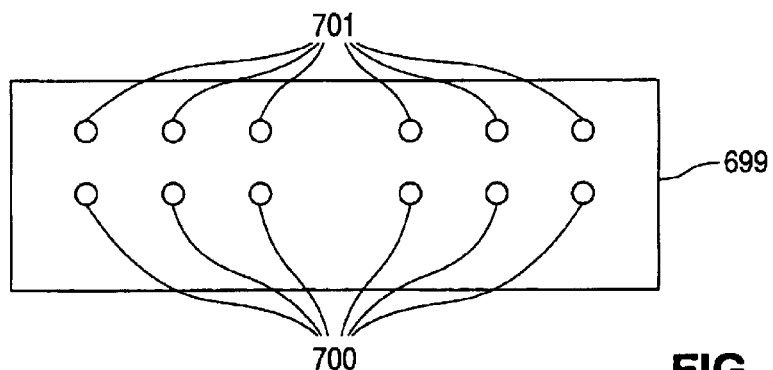

Another embodiment of the invention is depicted with respect to FIGS. 6A–6C. FIG. 6A is a cross section view of a ceramic block embodiment. FIG. 6B is a plan view of a face surface of the ceramic block embodiment depicted in FIG. 6A. The cross-section view of FIG. 5A is taken along the line 6a–6a' of FIG. 6B. As with the previously disclosed embodiments the depicted ceramic block 614 can be used in an optical subassembly (OSA) used in an opto-electronic module.

The ceramic block 614 has a front surface 618 and a bottom surface 620. The depicted embodiment includes a device attachment area 632 (cathode pad) formed on the front surface 618 with photonic devices 612 formed thereon. Contact pads 638, 639 are formed on the front surface 618 and are electrically connected to the photonic devices 612 using bonding wires 633. As depicted in FIG. 6B, in this embodiment the contact pads include a first set of contact pads 638 and a second set of contact pads 639 configured in an offset staggered arrangement with respect to each other. In such an implementation, the photonic devices 612 can be implemented as a first set of photonic devices 612' and a second set of photonic devices 612" which are electrically connected to a first set of contact pads 638 and a second set of contact pads 639 respectively. This configuration allows more separation between the contact wires 633 thereby reducing cross-talk.

As with the previously described embodiments, the signal connections that connect the photonic devices 612 to the solder pads 606 are formed as described elsewhere in this patent. Such signal connections pass through internal portions of the ceramic block 614 to electrically connect the photonic devices 612 to the solder pads 606 formed on the bottom surface 620 of the block. As previously described, the signal connections include signal vias 651, signal traces 652, and corresponding contact pads 638 and solder pads 606. Referring to FIG. 6A, a signal connection to a contact pad 638 includes a signal via 651 that passes through one or more ceramic layers 650 of the block 614. The signal via 651 is electrically connected to a signal trace 652 formed on one of the ceramic layers 650. The signal trace 652 extends to the edge of the block 614 at the bottom surface 620 where a solder pad 606 is formed thereon. Similarly, for the second set of bond pads 639, signal connections pass through internal portions of the ceramic block 614 to electrically connect the second set of bond pads 639 to the solder pads 606 formed on the bottom surface 620 of the block. The signal connection for contact pad 639 includes a signal via 681 (depicted by the indicated dashed line) that passes through one or more ceramic layers 650 of the block 614 and electrically connects to a signal trace 682 (depicted by the indicated dashed line) formed on one of the ceramic layers 650. The signal trace 682 extends to the bottom surface 620 of the block 614 where a solder pad 606 is formed thereon.

The depicted embodiment uses two grounds. Both grounds pass through internal portions of the ceramic block 614. The ground connections electrically connect the photonic devices 612 to an associated solder pad 606. In the depicted embodiment, a first set of photonic devices 612' associated with the first set of bond pads 638 is contacted to a first ground line 672. A first ground via 671 is electrically connected to the first set of photonic devices 612' at the device attachment area 632 and also to a first ground line 672. The first ground line 672 is electrically connected to a corresponding solder pad 606. Thus, a first ground connection electrically interconnects a photonic device 612 to uplinking contacts of a chip sub-assembly (CSA). It is to be noted that the depicted ground line 672 can comprise a single ground line to which all the first photonic devices 612' are electrically connected and thereby grounded. In such an implementation the single ground line 672 is formed on a ceramic layer 650 thereby defining a first ground plane 601. Alternatively, and advantageously, the first ground line 672 can comprise a plurality of individual ground lines so that each photonic device 612' can be individually grounded.

Also, the second ground passes internally through the ceramic block 614. A second set of photonic devices 612" associated with the second set of bond pads 639 is contacted to a second ground line 662. Such ground connections electrically connect the photonic devices 612" to an associated solder pad 606. A second ground via 661 is electrically connected to the second set of photonic devices 612" at the device attachment area 632 and also to a second ground line 662. The second ground line 662 is electrically connected to a corresponding solder pad 606. Thus, a second ground connection electrically interconnects a photonic device 612" to uplinking contacts of a chip sub-assembly (CSA). It is to be noted that the depicted second ground line 662 can comprise a single ground line to which all the second photonic devices 612" are electrically connected and thereby grounded. In such an implementation the single ground line 662 is formed on a ceramic layer 650 thereby defining a second ground plane 602. A described previously, second ground line 662 can comprise a plurality of individual ground lines so that each photonic device 612" can be individually grounded.

Optionally, a shield plane 690 can be introduced between the two sets of electrical connections for the first set of photonic devices 612' and the second set of photonic devices 612". The shield plane 690 includes a shield layer 699 of metallic material formed to reduce the cross-talk between the first set of photonic devices 612' and the second set of photonic devices 612". Such a shield plane 690 includes openings to facilitate the vias passing through the shield plane 690. This can be illustrated with respect to FIG. 6C. FIG. 6C depicts an embodiment for a shield layer 699 in accordance with the principles of the invention. The depicted shield layer 699 includes openings 700, 701 that allow vias and electrical connections to pass. For example, openings 700 permit the passage of ground vias 661 and openings 701 permit the passage of signal vias 681. Additionally, in embodiments where each photonic devices include an individual ground connection and an individual signal connection, such shielding can be formed about each pair of signal and ground connections.

Figure 7:
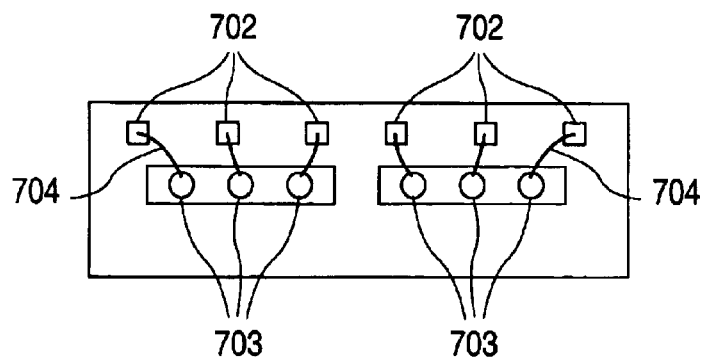
FIG. 7 is a simplified depiction of another block embodiment configured so that electrical connections are shown fanning outwards as they extend away from photonic devices in accordance with the principles of the invention.

Referring to FIG. 7, block embodiments encompass implementations wherein the spacing pitch between the contact pads 702 of a set of contact pads is greater than the spacing pitch between individual photonic devices 703 of an associated set of photonic devices. Thus, the associated electrical connections 704 (e.g., gold bonding wires) are shown to fan outwards as they extend away from photonic devices 703 toward the contact pads 702. They extend outwards such that each of contact pads 702 separated from each other by a distance greater than the distance between each of photonic devices 703. This fanned-out configuration increases the ability to shield each of electrical connections 704 from each other since the distance between each of the connections is increased. The greater distance between each of contact pads 702 also allows greater room for forming contacts with up-linking contacts on a CSA. Specifically, more room is provided for solder ball interconnects.

Figure 8:
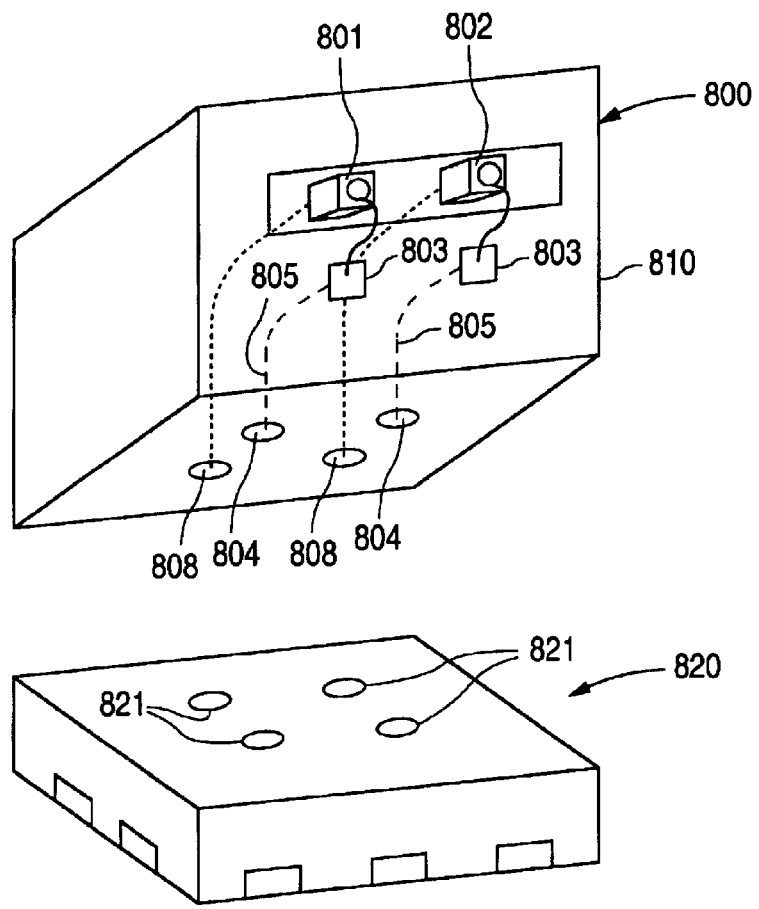
FIG. 8 is a simplified perspective depiction of a two channel opto-electronic transceiver constructed in accordance with the principles of the invention.

One specific implementation of the principles of the present invention is a two channel opto-electronic transceiver. A simplified implementation of such a transceiver is schematically depicted in FIG. 8. Such a transceiver is formed on an OSA 800 that includes a ceramic block 810 formed using HTCC or LTCC processes. The block 810 includes a send channel that includes an optical emitter photonic device 801 (e.g., a semiconductor laser device) and a receive channel that includes an optical receiver photonic device 802. The photonic devices (801, 802) are arranged in a standard MPO format for interface with standard fiber optic ferrule devices. The embodiment can include shielding to additionally reduce cross-talk. The photonic devices (801, 802) are electrically connected to the contact pads 803. Additionally, the contact pads 803 are electrically connected to the solder pads 804 by electrical connections 805 (depicted schematically by the dashed lines) that pass through the inside of the block 810. In the depicted embodiment, two ground planes are used and ground connections electrically connect the ground to solder pads 808 by ground electrical connections 806 (depicted schematically by the dashed lines) that are also depicted as passing through the inside of the block 810. Shielding may also optionally be employed. The CSA 820 includes electrical up-link connections 821 that can be electrically connected to the solder pads 804, 808 of the OSA to electrically interconnect the photonic devices 801, 802 of the OSA 800 to a semiconductor chip (not shown) encapsulated within the CSA 820.

The embodiments of the present invention provide the advantages of less crosstalk, reduced parasitics, reduced ground-bounce effect, increased connection density, and it makes it easier to control the impedance levels. In one embodiment, total crosstalk of the order of 2.5% can be obtained on a 12-channel module (12 emitters or detectors or combination thereof) at 3.125 Gbps data transmission rate. Various electrical performance characteristics can be achieved by adjusting the spacing of between the contact pads, the width of the electrical connections, the size and spacing of all components as determined by the size of the ceramic blocks.

The OSA of the present invention can be manufactured to various size and performance specifications and therefore is suitable for use with many different connectors and systems. For instance, the OSA is compatible with an MPO connector, which can be implemented with 2-fiber or 12-fiber ribbons (as well as other well known sizes and configurations). The circuitry substrate of the invention can be used in various applications for connecting two electrical systems. Again, the circuitry substrate can advantageously be used with systems that are very small because of its small size, low cost, and excellent electrical performance.

Figure 9A:
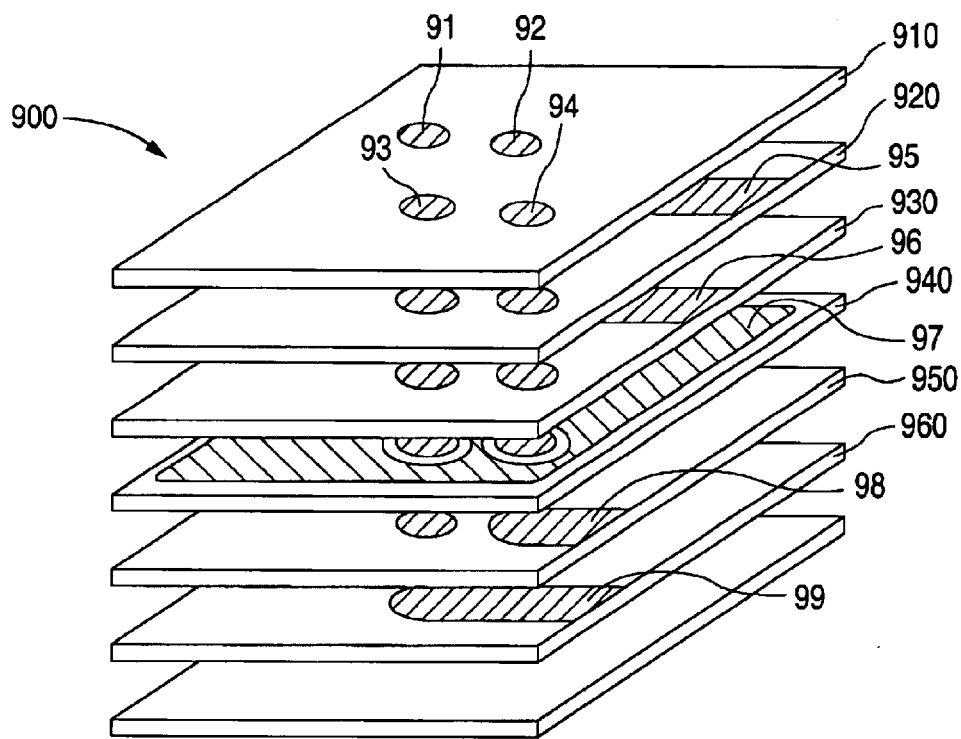
FIG. 9A is a simplified depiction of the ceramic laminate components used to construct one simplified ceramic block embodiment in accordance with the principles of the invention.

Referring now to FIG. 9A, a ceramic body can made using LTCC or HTCC processing steps well-known in the microelectronic packaging industry. A plurality of ceramic sheets 910, 920, 930, 940, 950, 960, and 970 are processed together to form the desired ceramic body. The depicted ceramic body is structured to include a shield layer, signal connections, and ground connections. For example, the top layer 910 is to be the front surface of the body. Photonic devices and alternating contact pads will be formed thereon. The sheet 910 may then be stamped or punched to form a preform having vias into which are placed electrically conductive material such as metal paste or epoxy doped with electrical conductivity enhancing material such as silver to form conductive vias 91, 92, 93, 94 in the sheet 910. These regions are sized and located to correspond with desired circuit patterns. For example, here via 93 corresponds to an electrical interconnection structure that will be used for a signal interconnection for a first photonic device. A contact pad will be formed over the metal of via 91. Vias 92 and 93 will be used for a ground connections that will pass deeper into the body. A device attachment area can later be formed over the vias 92 and 93. Via 94 is used for another signal connection. Layer 920 includes further conductive vias that underlie vias 91, 93, and 94. Additionally, a signal trace 95 is formed extends all the way to the edge of sheet 920. The signal trace 95 underlies and electrically connects to the via 91. Layer 930 includes further conductive vias that underlie vias 93 and 94. Additionally, a ground line 96 is formed extends all the way to the edge of sheet 930. The ground line 96 underlies and electrically connects to the via 92. Layer 940 includes a shield layer 97 that includes openings so that further conductive vias can be formed that underlie vias 93 and 94. The shield layer 97 is constructed of conductive material (e.g., copper) and is configured so that it does not contact the conductive materials underlying vias 93 and 94. Layer 950 includes a further conductive via that underlies via 93. Additionally, a signal trace 98 is formed such that it extends all the way to the edge of sheet 950. The signal trace 98 underlies and electrically connects to the via 94. Layer 960 includes a ground line 99 is formed extends all the way to the edge of sheet 960. The ground line 99 underlies and electrically connects to the via 93. Finally, a bottom sheet 970 can be used under the other sheets. Typically, the sheets are bonded together by bonding materials such as epoxy. Preferably, a B-stage type electrically non-conductive material is selected. In this way, sensitive circuit paths may be routed in the body.

Figure 9B:
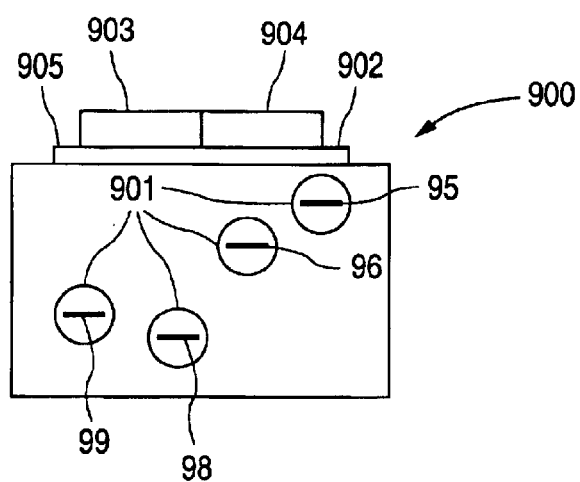
FIG. 9B is a simplified plan view of the assembled and sintered ceramic laminate components depicted in FIG. 9A.

FIG. 9B depicts an edge on view of the body 900 after assembly and sintering. A device attach pad 902 has been formed on the facing surface of the body 900 and two photonic devices 903, 904 have been formed on the device attach pad 902. Contact pads (only the nearest pad 905 being visible in this view) are also formed on the facing surface of the body 900. The edges of the conductive lines (95, 96, 98, and 99) are exposed on the bottom surface of the body. Solder pads 901 are formed over the edges of the conductive lines (95, 96, 98, and 99). Later solder balls can be formed on the solder pads 901 which are then reflowed to the uplink contacts of an associated CSA to complete an opto-electronic module.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. An optical sub-assembly (OSA) suitable for optical interconnection with optical fibers and electrical interconnection with a chip sub-assembly (CSA), the OSA comprising;

a ceramic block having a first face and a second face, the ceramic block being formed using one of low temperature co-fired ceramic (LTCC) and high temperature co-fired ceramic (HTCC);

at least one photonic device formed on a first face of the ceramic block;

at least one signal connection that passes through internal portions of the ceramic block, each signal connection being suitable for electrically connecting a photonic device to a chip sub-assembly (CSA);

at least one ground; and at least one ground connection that passes through internal portions of the LTCC block and electrically connects a photonic device to an associated ground of the at least one ground.

2. The optical sub-assembly (OSA) of claim 1 wherein the at least one ground is electrically connected to the chip sub-assembly.

3. The optical sub-assembly (OSA) of claim 2 wherein the at least one ground passes through internal portions of the ceramic block.

4. The optical sub-assembly (OSA) of claim 3 wherein the at least one photonic device comprises a plurality of photonic devices;

wherein the at least one ground includes a plurality of grounds; and wherein the at least one ground connection that passes through internal portions of the ceramic block comprises a plurality of ground connections configured so that each ground connection electrically connects a photonic device to an associated ground.

5. The optical sub-assembly (OSA) of claim 4 wherein each ground of the plurality of grounds is shielded from other grounds by a metal shield layer.

6. The optical sub-assembly (OSA) of claim 1 wherein the at least one ground comprises a single ground plane.

7. The optical sub-assembly (OSA) of claim 6 wherein the at least one ground comprises two ground planes.

8. The optical sub-assembly (OSA) of claim 7 wherein the two ground planes are shielded from each other by a shield plane.

9. The optical sub-assembly (OSA) of claim 1 wherein the at least one photonic device comprises a plurality of photonic devices;

wherein a plurality of bonding pads are formed on the first face of the ceramic block;

wherein a first end of each signal connection is electrically connected to one of the plurality of bonding pads and wherein each bonding pad is wire bonded to an associated one of the plurality of photonic devices thereby establishing electrical connections to the photonic devices;

wherein a plurality of contact pads are formed on a second face of the ceramic block; and wherein a second end of each signal connection is electrically connected to one of the plurality of contact pads, such signal connection passing internally through the ceramic block, thereby establishing electrical connection between photonic devices and the plurality of contact pads.

10. The optical sub-assembly (OSA) of claim 9 wherein the plurality of bonding pads are formed in two groups, a first set of bond pads being formed on one side of the photonic devices and a second set of bond pads being formed on an opposite side of the photonic devices, the sets of bond pads are arranged such that the bond pads of the first set are staggered with respect to the bond pads of the second set and such that the wire bonds to each bond are correspondingly staggered.

11. The optical sub-assembly (OSA) of claim 9 further comprising:

a semiconductor chip sub-assembly (CSA) having a top surface that has exposed up-linking contacts; and wherein the OSA including the ceramic block is placed onto the top surface of the CSA such that the contact pads are placed in electrical communication with the up-linking contacts of the CSA and such that the at least one ground is placed in electrical communication with the up-linking contacts of the CSA.

12. The CSA of claim 11 wherein the CSA is a leadless leadframe package.

13. An optoelectronic module comprising:

a ceramic block having a front surface and a bottom surface, the ceramic block being formed using one of low temperature co-fired ceramic (LTCC) and high temperature co-fired ceramic (HTCC), the ceramic block including, a device attachment area formed on the front surface;

photonic devices formed on the device attachment area;

solder pads formed on the bottom surface of the ceramic block;

electrical contact lines that pass internally through the ceramic block, the electrical contact lines including, contact pads formed on the front surface of the ceramic block;

signal connections that pass through internal portions of the ceramic block to electrically connect the contact pads to associated solder pads;

wire bonds for electrically connecting the contact pads with the photonic devices;

grounds that are electrically connected to selected solder pads;

ground connections that pass through internal portions of the ceramic block to electrically connect the device attachment area to the grounds; and a semiconductor chip sub assembly (CSA) having a top surface that has exposed up-linking contacts, wherein the ceramic block is placed onto the top surface of the CSA such that the solder pads formed on the bottom surface of the ceramic block are placed in electrical communication with the up-linking contacts of the CSA.

14. An optoelectronic module as recited in claim 13 wherein the module comprises an optical transceiver wherein the photonic devices comprise an optical transmitter and an optical receiver.

15. An optoelectronic module as recited in claim 13 wherein the module includes twelve photonic devices.

16. An optoelectronic module as recited in claim 13 wherein the contact pads formed on the front surface of the ceramic block are formed in two sets of contact pads so that a first set of contact pads is formed on a first side of the photonic devices and a second set of contact pads is formed on a second side of the photonic devices.

17. An optoelectronic module as recited in claim 16 wherein the contact pads of the first set of contact pads are configured in a staggered arrangement with respect to the contact pads of the second set of contact pads.

18. An optoelectronic module as recited in claim 17 wherein the photonic devices formed on the device attachment area comprise n photonic devices, wherein n comprises an integer number of 2 or greater; and wherein the first set of contact pads comprises $$\frac{n}{2}$$

contact pads and wherein the second set of contact pads comprises $$\frac{n}{2}$$

contact pads.

19. An optoelectronic module as recited in claim 16 wherein the photonic devices formed on the device attachment area comprise n photonic devices, wherein n comprises an integer number of 2 or greater; and wherein the first set of contact pads comprises $$\frac{n}{2}$$

contact pads and wherein the second set of contact pads comprises $$\frac{n}{2}$$

contact pads.

20. An optoelectronic module as recited in claim 16 wherein the signal connections associated with the first set of contact pads are shielded from the signal connections associated with the second set of contact pads.

21. An optoelectronic module as recited in claim 13 wherein the distance between the bond pads is greater than the distance between the associated photonic devices.

22. An optoelectronic module comprising:
a ceramic block having a front surface and a bottom surface, the ceramic block including a plurality of ceramic layers, the block being formed using one of low temperature co-fired ceramic (LTCC) techniques and high temperature co-fired ceramic (HTCC) techniques, the block having:
the front surface having a device attachment area and contact pads formed thereon;
photonic devices formed on the device attachment area;
the bottom surface having solder pads formed thereon;
at least one internal electric contact plane having at least one electric contact line formed thereon such that the at least one electric contact line passes internally through the ceramic block, the at least one electric contact line being in electrical communication with the contact pads and associated solder pads;
wire bonds for electrically connecting the contact pads with the photonic devices;
at least one internal ground plane having at least one ground contact line formed thereon such that the at least one ground contact line passes internally through the ceramic block, the at least one ground contact line being in electrical communication with selected solder pads; and
a semiconductor chip sub assembly (CSA) having a top surface that has exposed up-linking contacts, wherein the ceramic block is placed onto the top surface of the CSA such that the solder pads formed on the bottom surface of the ceramic block are placed in electrical communication with the up-linking contacts of the CSA.

23. An optoelectronic module as in claim 22, wherein the contact pads formed on the front surface of the ceramic block are formed in two sets of contact pads so that a first set of contact pads is formed on a first side of the photonic devices and a second set of contact pads is formed on a second side of the photonic devices;
wherein the at least one internal electric contact plane comprises two internal electric contact planes, a first internal electric contact plane and a second internal electric contact plane;
wherein the first set of contact pads is in electrical communication with the at least one electric contact line formed on the first internal electric contact plane and wherein the at least one electric contact line formed on the first internal electric contact plane is in electrical communication with associated solder pads; and
wherein the first internal electric contact plane and the second internal electric contact plane are shielded from each other.

24. An optoelectronic module as in claim 23, wherein the at least one internal ground plane includes a single ground plane having at least one ground contact line, the at least one ground contact line being in electrical communication with the die attachment pad and selected solder pads.

25. An optoelectronic module as in claim 24, wherein the single ground plane includes a single ground contact line being in electrical communication with the device attachment area and a selected solder pad.

26. An optoelectronic module as in claim 23, wherein the at least one internal ground plane includes a two ground planes, a first ground plane and a second ground plane, each having at least one ground contact line, the at least one ground contact line being in electrical communication with the device attachment area and selected solder pads.

27. An optoelectronic module as in claim 26, wherein the first ground plane is associated with the photonic devices electrically connected with the first set of contact pads and wherein the second ground plane is associated with the photonic devices electrically connected with the second set of contact pads.

28. An optoelectronic module as in claim 27, wherein the first ground plane is and the first set of contact pads are shielded from the second ground plane and the second set of contact pads.

29. An optoelectronic module as in claim 23, wherein the photonic devices are electrically connecting the contact pads using the bonding wires in an alternating configuration such that odd numbered photonic devices are electrically connected with the contact pads of the first set of contact pads and such that even numbered photonic devices are electrically connected with the contact pads of the second set of contact pads.

30. An optical sub-assembly (OSA) suitable for optical interconnection with optical fibers and electrical interconnection with a chip sub-assembly (CSA), the OSA comprising:
a ceramic block having a first surface and a second surface, the ceramic block being formed using one of low temperature co-fired ceramic (LTCC) and high temperature co-fired ceramic (HTCC);
at least one photonic device formed on the first surface of the ceramic block;
a plurality of electrical contacts suitable for electrical communication with a chip sub-assembly, the plurality of electrical contacts formed on the second surface of the ceramic block; and a plurality of electrical connections that pass internally through the ceramic block so that the photonic devices on the first face of the block are electrically connected with the plurality of electrical contacts on the second face of the block.

31. The OSA of claim 30, wherein the plurality of electrical contacts include ground connections and signal connections configured such that each photonic device is electrically connected with at least one electrical connection and at least one ground connection.

32. The OSA of claim 30, wherein each electrical contact includes a contact pad formed on the first surface of the ceramic block, each contact pad being in electrical communication with an associated photonic device and wherein each electrical contact includes a solder pad formed on the second surface of the ceramic block, each solder pad being suitable for electrical connection with an associated up-linking contact on a chip sub-assembly.

33. The OSA of claim 32, wherein the at least one photonic device is electrically connected to the contact pads using a contact wire; and wherein the contact pads are configured in two sets of contact pads arranged such that a first set of contact pads formed on one side of the at least one photonic device and such that a second set of contact pads is formed on another side of the at least one photonic device thereby increasing the distance between the contact wires and thereby reducing cross-talk.

34. The OSA of claim 30, wherein the ceramic block includes internal shielding configured to reduce cross-talk in the OSA.

* * * * *